United States Patent [19]

Hillman et al.

[11] Patent Number: 4,856,456

[45] Date of Patent: Aug. 15, 1989

[54] APPARATUS AND METHOD FOR THE FLUID TREATMENT OF A WORKPIECE

[75] Inventors: Gary Hillman, Livingston; Richard H. Rubin, Fairfield; Bernard H. Paulfus, West Milford, all of N.J.

[73] Assignee: Machine Technology, Inc., Parsippany, N.J.

[21] Appl. No.: 252,762

[22] Filed: Oct. 3, 1988

[51] Int. Cl.[4] .............................................. B05C 11/14
[52] U.S. Cl. ..................................... 118/500; 118/400; 118/600; 118/402; 118/504; 118/505; 118/416; 118/52
[58] Field of Search ............... 118/400, 600, 402, 500, 118/504, 505, 416, 52; 206/303

[56] References Cited

U.S. PATENT DOCUMENTS

| | | | |
|---|---|---|---|
| 4,281,031 | 7/1981 | Hillman | 427/45.1 |
| 4,315,705 | 2/1982 | Flint | 118/52 |
| 4,517,752 | 5/1985 | Devico | 34/58 |
| 4,655,162 | 4/1987 | Kameyama | 118/416 |
| 4,674,521 | 6/1987 | Paulfus | 118/52 |
| 4,685,852 | 8/1987 | Rubin | 118/500 |
| 4,711,610 | 12/1987 | Riehl | 51/235 |
| 4,722,298 | 2/1988 | Rubin | 118/715 |
| 4,791,880 | 12/1988 | Aigo | 118/416 |

*Primary Examiner*—Shrive Beck
*Assistant Examiner*—Vi Duong Dang
*Attorney, Agent, or Firm*—Lerner, David, Littenberg, Krumholz & Mentlik

[57] ABSTRACT

An apparatus and method achieves the submersion­type processing of silicon wafers in a manufacturing process for the fabrication of semiconductor devices therefrom. The silicon wafer is uniformly flooded with the process fluid in a manner which prevents impingement thereof during chemical processing, such as wet etching, cleaning, photoresist developing and the like. Upon flooding the silicon wafer, a gas pocket is formed between a portion of the lower surface of the wafer and an adjacent portion of vacuum chuck to which the wafer is mounted. The resulting gas pocket prevents accumulation of processed fluid therein to facilitate spin drying of the wafer.

30 Claims, 6 Drawing Sheets

APPARATUS AND METHOD FOR THE FLUID TREATMENT OF A WORKPIECE

BACKGROUND OF THE INVENTION

The present invention relates in general to an apparatus and method for the fluid treatment of individual workpieces, such as silicon wafers and the like, by a variety of processing chemicals. More specifically, the present invention is directed to an automated apparatus, in modular form, and method for the chemical treatment by the submersion of the working surface of a silicon wafer in a treating fluid in connection with the manufacture of semiconductor devices therefrom in a manner such that contamination from residual waste chemicals is effectively eliminated during spin drying of the processed wafer.

In the processing of silicon wafers for the manufacture of semiconductor devices therefrom, a number of separate operations must be performed on each wafer. Typically, these operations involve the application of a process chemical to the working surface of the silicon wafer. Different chemicals, for example, acids, bases, developers and solvents, are commonly used in the various chemical operations of wet etching, developing, cleaning, photoresist removal and the like. U.S. Pat. No. 4,281,031 discloses an apparatus for performing a number of such operations on a silicon wafer while it is positioned at a single location or work station. On the other hand, U.S. Pat. No. 4,722,298 discloses a modular processing system which permits the plural arrangement of self-contained processing modules which are independently replaceable as a stand-alone unit with a modular adapted to perform the same or different operation.

In either arrangement, the processing of silicon wafers frequently require that the entire working surface of the wafer be evenly and substantially simultaneously subjected to the treating fluid without impingement on a deposited layer, for example, a photoresist layer. It has been known to submerge silicon wafers either individually or within a cassette of multiple wafers in a bath containing the treating fluid. However, in most circumstances, it is only desired that one surface of the silicon wafer be subjected to the treating fluid, which cannot be achieved by the known submersion techniques. Further, as single silicon wafers are usually processed by mounting to a vacuum chuck, the submersion of the mounted wafer often results in the retention of waste fluids around the chuck even after spin drying. Even a small quantity of retained waste fluid may ultimately contaminate the present and subsequent silicon wafers. In this event, the contaminated silicon wafers are unusable for further processing in the manufacture of semiconductor devices therefrom.

The processing of multiple wafer cassettes also has its disadvantages. For example, all silicon wafers in the cassette must be processed simultaneously, thereby necessitating a large inventory, as well as losing the ability to process silicon wafers individually. The processing of multiple silicon wafers also requires that the entire cassette be submerged and then spun in order to dry the contained wafers. In addition to the difficulty of spinning a large cassette, this spinning cannot assure removal of the waste fluid from each of the silicon wafers, as such waste fluid may accumulate within the interstices of the cassette, further contaminating the present and subsequent wafers.

It can therefore be appreciated that it is desirable during the processing of silicon wafers to ensure that the waste fluid is completely removed to prevent further contamination of wafers being processed. U.S. Pat. No. 4,517,752 discloses an apparatus for continuously draining waste fluids from a silicon wafer in a manner which retards the splashback of fluids upon the wafer during spinning. However, these waste fluids are still prone to collect at a location underlying the silicon wafer surrounding the chuck.

SUMMARY OF THE INVENTION

It is broadly an object of the present invention to provide an apparatus and method adapted for the fluid treatment of workpieces, such as silicon wafers and the like, in the manufacture of semiconductor devices therefrom, and which overcomes or avoids one or more of the foregoing disadvantages resulting from the use of the known apparatuses and methods employed in the submersion of single or multiple silicon wafers in a fluid bath and subsequent removal of the waste fluid by spin drying.

Another object of the present invention is to provide an apparatus and method for the fluid treatment of a workpiece wherein the working surface of the workpiece is uniformly and substantially simultaneously flooded with the treating fluid without impingement thereon.

Another object of the present invention is to provide an apparatus and method for the fluid treatment of a workpiece which prevents accumulation of waste liquid within a region underlying the silicon wafer and surrounding an adjacent portion of a chuck adapted for securing the wafer thereto.

Another object of the present invention is to provide an apparatus and method for the fluid treatment of a workpiece which prevents contamination of the present and subsequent workpieces with waste fluid.

Another object of the present invention is to provide an apparatus and method for the fluid treatment of a workpiece which is adapted for the processing of single workpieces by submersion in a fluid bath, for example, in development of photoresist, in photoresist stripping, in etching, in cleaning, in development and the like.

Another object of the present invention is to provide an apparatus and method for the fluid treatment of a workpiece by submersion of its working surface while minimizes fluid contact with the other surface of the workpiece.

In accordance with one embodiment of the present invention, there is provided an apparatus for the fluid treatment of a workpiece, the apparatus is constructed of mounting means for mounting a workpiece thereto, fluid supplying means for supplying a fluid for treating the surface of the workpiece, and forming means for forming a gas pocket between a portion of the mounting means and a portion of the workpiece upon supplying the fluid to the workpiece from the fluid supplying means, whereby the gas pocket prevents contact of the fluid with the portion of the mounting means and the portion of the workpiece.

In accordance with another embodiment of the present invention, there is provided in an apparatus for treating with a fluid a workpiece mounted to a chuck, a device constructed of a body having an upper surface surrounding the chuck underlying the workpiece, the upper surface forming an annular chamber surrounding a portion of the chuck and underlying a portion of the workpiece, the annular chamber trapping a pocket of gas upon supplying the fluid to the workpiece, whereby the pocket of gas prevents contact of the fluid with the portion of the chuck and the portion of the workpiece.

In accordance with another embodiment of the present invention, there is provided a method of treating with a fluid the upper surface of a workpiece mounted to a chuck, the method comprising supplying a fluid to a region below the workpiece surrounding the chuck, trapping a pocket of gas between a portion of the chuck and a portion of an adjacent lower surface of the workpiece to prevent fluid accumulation therein, continuing to supply the fluid until the fluid flows over the upper surface of the workpiece.

In accordance with another embodiment of the present invention, there is provided a method of treating with a fluid the upper surface of a workpiece mounted to a chuck, the chuck surrounded by a body having a upper surface underlying the workpiece and extending outward to form an annular reservoir surrounding the periphery of the workpiece, the method being rotating the body, supplying a fluid to the annular reservoir for accumulation therein as a result of centrifugal force created by rotation of the body, and stopping the rotation of the body whereby a portion of the fluid accumulated in the annular reservoir flows into a region between the lower surface of the workpiece and the upper surface of the body to trap a pocket of gas between a portion of the chuck and a portion of an adjacent lower surface of the workpiece to prevent fluid accumulation therein, another portion of the fluid accumulated in the annular reservoir flowing over the upper surface of the workpiece.

In accordance with another embodiment of the present invention, there is provided a method of treating with a fluid the upper surface of a workpiece mounted to a chuck, the chuck surrounded by a body having an upper surface underlying the workpiece and extending outward to form an annular reservoir surrounding the periphery of the workpiece, the method being inserting a fluid barrier between the annular reservoir and a region provided between the lower surface of the workpiece and the upper surface of the body to prevent fluid communication therebetween, supplying a fluid to the annular reservoir for accumulation therein, and at least partially removing the fluid barrier to allow a portion of the fluid accumulated in the annular reservoir to flow into the region to trap a pocket of gas between a portion of the chuck and a portion of an adjacent lower surface of the workpiece to prevent few fluid accumulation therein, another portion of the fluid accumulated in the annular reservoir flowing over the upper surface of the workpiece.

BRIEF DESCRIPTION OF THE DRAWINGS

The above description, as well as further objects, features and advantages of the present invention will be more fully understood with reference to the following detailed description of a presently preferred, but nonetheless illustrative, apparatus and method for the fluid treatment of a workpiece, when taken in conjunction with the accompanying drawings, wherein.

DETAILED DESCRIPTION

Figures 1, 2:
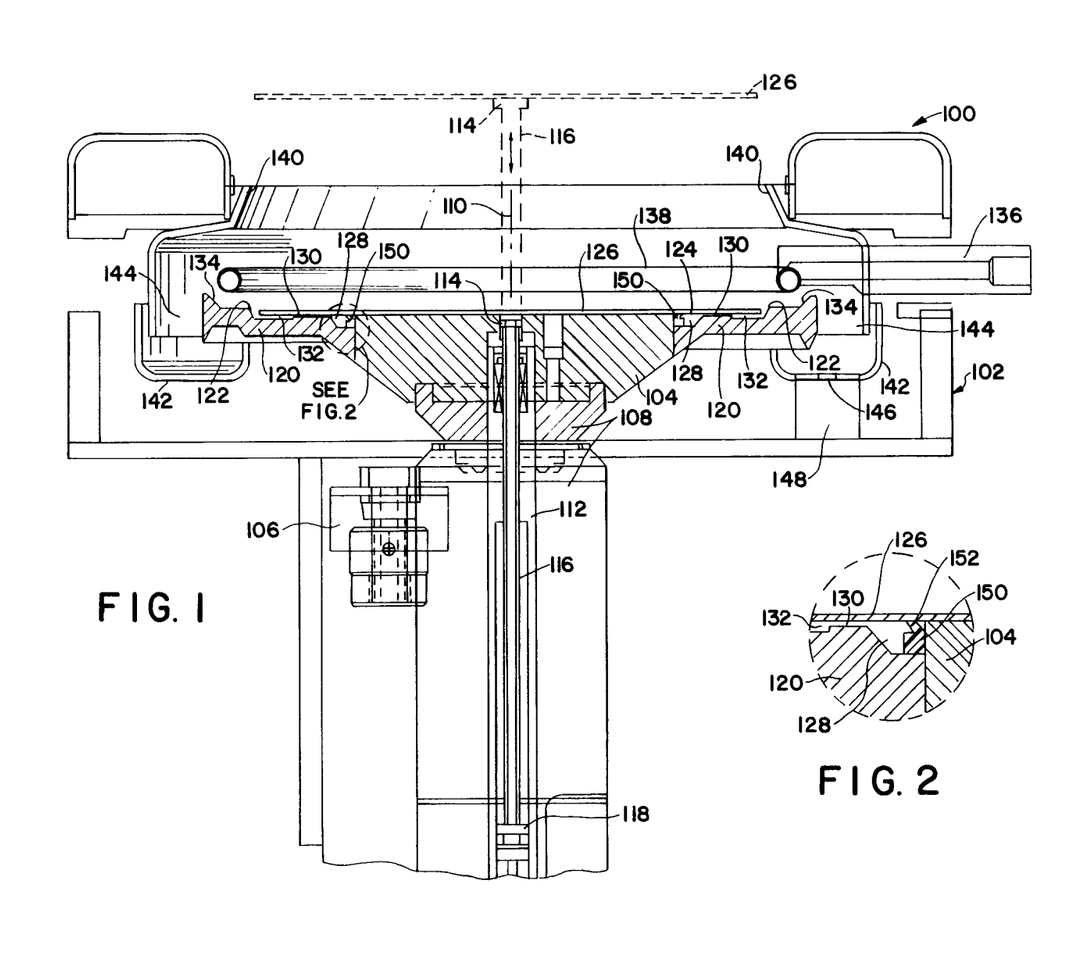
FIG. 1 is a side elevational view, in partial cross-section, illustrating an apparatus for the fluid treatment of a workpiece in accordance with one embodiment of the present invention.
FIG. 2 is an enlarged cross-sectional view of that portion of FIG. 1 contained within the circle of dotted lines.

Turning now to the drawings, wherein like reference numerals represent like elements, there is shown in FIG. 1 an apparatus for the fluid treatment of a workpiece constructed in accordance with one embodiment of the present invention and designated generally by reference numeral 100. The apparatus 100 is particularly used in the manufacture of semiconductor devices and ultimately integrated circuits from silicon wafers which are subjected to a variety of process operations. As previously noted, the apparatus 100 is adapted to the processing of silicon wafers where there is required the treatment of the wafer with a fluid in an immersion-type bath of acids, bases, solvents and the like for performing the processes of wet etching, cleaning, developing and the like. To this end, the apparatus 100 submerges the exposed planar working surface of the silicon wafer with the treating fluid substantially simultaneously and evenly without impingement upon any existing process layer such as a photoresist layer. In addition, the apparatus 100 facilitates the complete removal of the waste fluid during the spin drying operation by preventing accumulation of waste fluid in an annular region surrounding the undersurface of the wafer and the vacuum chuck employed for securing the wafer thereto. It should be understood that the present invention is not to be limited to the environment of the processing of silicon wafers, but may be used widely in other environments. The environment of processing of silicon wafers is provided for illustration purposes only.

Referring to the embodiment shown in FIG. 1, the apparatus 100 is constructed of a housing 102 which surrounds a vacuum chuck 104. The vacuum chuck 104 may be constructed in a variety of types, for example, such as that disclosed in U.S. Pat. No. 4,711,610. The vacuum chuck 104 is coupled to a motor 106 by means of a linkage assembly 108. Upon operation of the motor 106, the vacuum chuck 104 will be rotated about axis 110 at predetermined revolutions per minute as required by the process operation being performed.

An opening 112 extends axially through the linkage assembly 108 and vacuum chuck 104. A secondary vacuum chuck 114 is received within the opening 112 adjacent the surface of vacuum chuck 104 and is attached to one end of a hollow longitudinally-extending tubular member 116 adapted to communicate the secondary vacuum chuck with a source of vacuum. The other end of the tubular member 116 is coupled to an axial displacement assembly 118 adapted to displace the secondary vacuum chuck 114 axially along axis 110 as indicated by the dashed lines and double headed arrow.

An annular body 120 extends radially outward surrounding the perimeter of the vacuum chuck 104. In accordance with the preferred embodiment, the annular body 120 is formed integrally with the vacuum chuck 104 as a one-piece assembly. The annular body 120 includes a contour upper surface 122, a portion of which is arranged underlying an unsupported portion 124 of a circular workpiece or silicon wafer 126 which is mounted to the vacuum chuck 104. The annular body 120, by virtue of its contour upper surface 122, forms a pocket or annular chamber 128 surrounding the vacuum chuck 104 and underlying an adjacent portion of the silicon wafer 126. The contour upper surface 122 also forms an annular gap 130 underlying the silicon wafer 126 between the annular chamber 128 and a peripheral portion of the wafer. As best shown in FIG. 2, the distance between the lower surface of the silicon wafer 126 and the contour upper surface 122 forming the annular gap 130 is smaller than the corresponding distance forming the annular chamber 128.

The contour upper surface 122 also forms a first annular fluid reservoir 132 underlying the silicon wafer 126 about its peripheral portion outwardly of the annular gap 130. As best shown in FIG. 2, the distance between the lower surface of the silicon wafer 126 and the contour upper surface 122 forming the annular gap 130 is less than the corresponding distance forming the first annular fluid reservoir 132. It is, however, contemplated that the annular gap 130 may extend radially outward to the edge of the silicon wafer 126 such that the first annular fluid reservoir 132 will either be substantially or entirely absent from the apparatus 100 as shown.

The contour upper surface 122 further forms a second annular fluid reservoir 134 extending beyond the periphery or edge of the silicon wafer 126 and extending above its upper surface. The second annular fluid reservoir 134, by virtue of the contour upper surface 122, extends outward and upward with respect to the upper surface of the silicon wafer 126 at an obtuse angle. The particular angle of the second annular fluid reservoir 130 may be selected as desired. As will become apparent hereinafter, as the angle increases, the ability and efficiency of the apparatus 100 in spin drying waste liquid from the silicon wafer 126 will be greatly enhanced. On the other hand, the smaller the angle the greater the ability of the apparatus 100 to retain process fluid as an immersion-type bath for the silicon wafer 126.

Fluid for treating the silicon wafer 126, such as acids, bases, solvents and the like, is supplied through a fluid inlet 136 to an annular manifold 138 arranged overlying a portion of the second annular fluid reservoir 134. A configured splash guard 140 is arranged within the housing 102 surrounding the annular body 120 and extending upwardly above the annular manifold 138. An annular drain 142 is arranged within the housing 102 underlying a region 144 formed between the annular body 120 and the lower extent of the splash guard 140.

The annular drain 142 is provided with at least one opening 146 which communicates with a waste liquid outlet 148 for discharging waste liquids from the housing 102. In completing the construction of the apparatus 100, optionally, a resilient sealing member 150 of annular shape is positioned within the annular chamber 128 surrounding vacuum chuck 104. The resilient sealing member is provided with an upwardly extending finger 152 which engages the lower surface of the silicon wafer 126. The resilient sealing member may be constructed from a variety of materials, such as resilient plastics, rubbers and the like.

Figure 3:
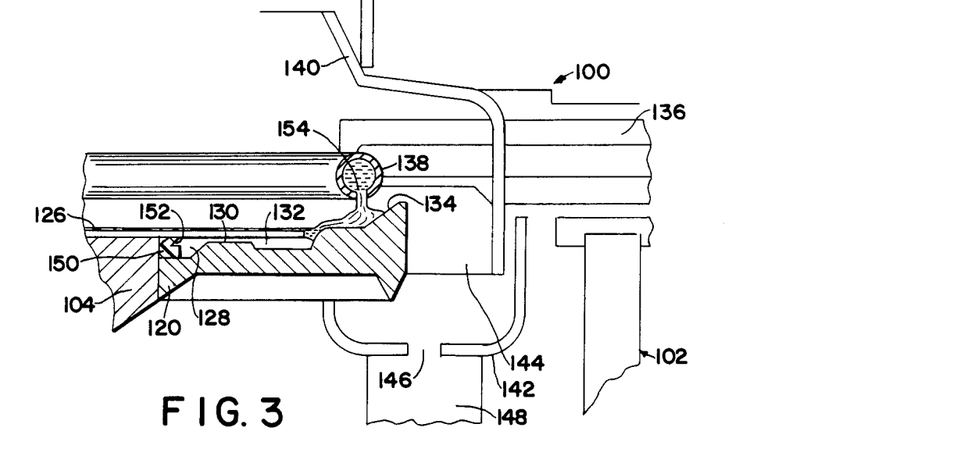
FIGS. 3–5 are sequential side elevational views, in partial cross-section, showing the method of the present invention for the fluid treatment of a workpiece in accordance with the operation of the apparatus illustrated in FIG. 1.
Figure 4:
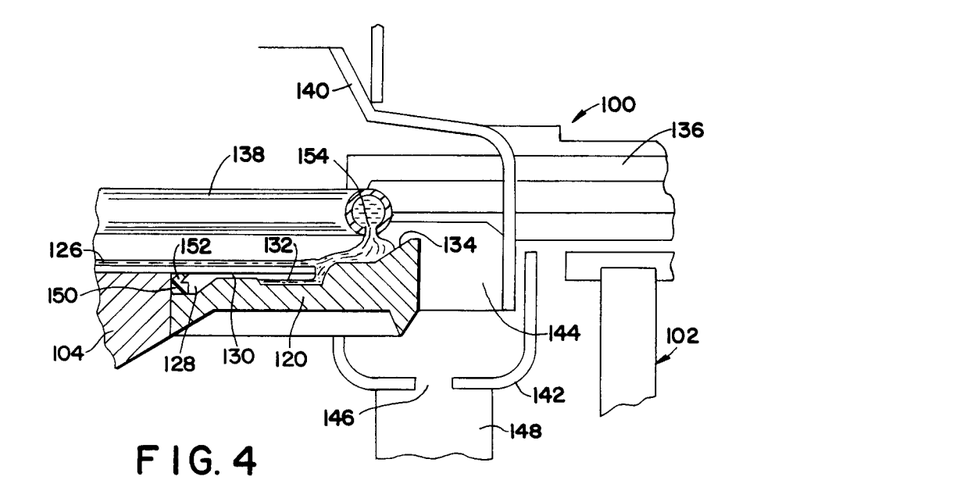
Figure 5:
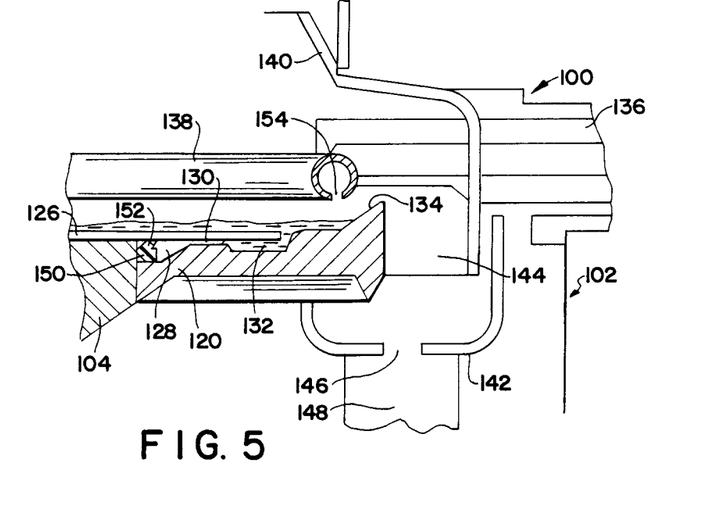

The method of the present invention in conjunction with the apparatus 100 will now be described with reference to FIGS. 3, 4 and 5. Initially, a silicon wafer 126 or other workpiece is mounted to the vacuum chuck 104 by means of the secondary vacuum chuck 114. Typically, silicon wafers 126 are stored within a cassette (not shown), stacked one upon the other in spaced apart relationship. A transport assembly (not shown) may be provided for transporting an individual silicon wafer 126 from its cassette to its position overlying the apparatus 100 as indicated by the dotted lines. The secondary vacuum chuck 114 is raised to a position in engagement with the lower surface of the silicon wafer 126 by means of the axial displacement assembly 118. The silicon wafer 126 is mounted to the secondary vacuum chuck 114 via vacuum which communicates thereto through the tubular member 116. Upon withdrawal of the secondary vacuum chuck 114 via the axial displacement assembly 118 into the axial opening 112, the silicon wafer 126 is placed upon the upper planar surface of vacuum chuck 104. The silicon wafer 126 is secured to the vacuum chuck 104 by means of vacuum created therebetween.

The process fluid for treating the surface of the silicon wafer 126 is supplied to the annular manifold 138 through fluid inlet 136. The process fluid simultaneously exits through a plurality of fluid outlets 154 directed downwardly from the annular manifold 138. As shown in FIG. 3, the process fluid initially is supplied to the second annular fluid reservoir 134. As a result of the annular body 120 having a contour upper surface 122 as herein described, the process fluid from the second annular fluid reservoir flows into the first annular fluid reservoir 132 without wetting the exposed upper planar surface of the silicon wafer 126. As the process liquid fills up the first annular fluid reservoir 132 until the level of the annular gap 130, a gas pocket, for example, air within the housing 102, becomes trapped within the annular chamber 128. Once the process fluid completely fills the first annular fluid reservoir 132, the gas pocket is trapped within the annular chamber 128 by means of the annular gap 130. As a result, the process fluid is prevented from wetting the vacuum chuck 104 and the adjacent lower surface of the silicon wafer 126.

In order to ensure the maintaining of a gas pocket within the annular chamber 128, an annular resilient sealing member 150 may be provided circumscribing the vacuum chuck 104 and having its finger 152 in sealing engagement with the lower surface of silicon wafer 126. The finger 152 forms a vacuum-tight seal with the lower surface of the silicon wafer 126, while the remaining portion of the annular resilient sealing member 150 forms a vacuum-tight seal with its engaged portion of the vacuum chuck 104 and annular body 120. The created seal prevents communication of vacuum from the vacuum chuck with the trapped gas pocket within the annular chamber 128 to prevent any loss of the trapped gas. However, where the vacuum chuck 104 provides a leaktight seal with the lower surface of the silicon wafer 126, the annular resilient sealing member 150 may be eliminated.

Once the first annular fluid reservoir 132 has been filled with the process fluid, any further process fluid supplied to the second annular fluid reservoir 134 immediately begins to flow over the exposed working surface of the silicon wafer 126. In this manner, there is an instantaneous rush of process fluid radially across the exposed upper surface of the silicon wafer 126 in a uniform non-impinging manner. The rate at which the working surface of the silicon wafer 126 is covered is dependent upon the size of the wafer and the rate at which the process fluid is supplied through the annular manifold 138. As shown in FIG. 5, the process fluid may be supplied to any depth above the working surface of the silicon wafer 126. Under these conditions, the lower surface of the silicon wafer 126 and adjacent portion of the chuck 104 bounding the annular chamber 128 is maintained dry and prevented from being wetted by the process fluid. Further, only a relatively small peripheral portion of the lower surface of the silicon wafer 126 has been wetted by the process fluid. This area may be reduced by decreasing the size of the first annular fluid reservoir 132.

After a predetermined residence time of the process fluid upon the exposed working surface of the silicon wafer 126, the process fluid may be removed by the spinning of the chuck 104 by means of motor 106. The centrifugal force created by rotation of the chuck 104 causes the process fluid to be discharged radially outward from the silicon wafer 126, the first annular fluid reservoir 132 and second annular fluid reservoir 134, as well as any process fluid which may have accumulated in the annular gap 130. The process fluid impinges upon the inner surface of the splash guard 140 and flows downward into the annular drain 142 to be removed by through waste liquid outlet 148. The splash guard 140 may be replaced by a splash retarder of the type disclosed in U.S. Pat. No. 4,517,752. In any event, the silicon wafer 126 is rendered dry and free from any residual waste liquid which previously had been known to accumulate around the lower surface of the wafer, and specifically, in the region surrounding the chuck 104. The resulting dry silicon wafer 126 may now be returned to its cassette via the secondary vacuum chuck 114 in reverse of the operation previously described. Individual silicon wafers 126 may be processed, one at a time, until an entire cassette of such wafers have been processed and transferred to another processing station.

Figure 6:
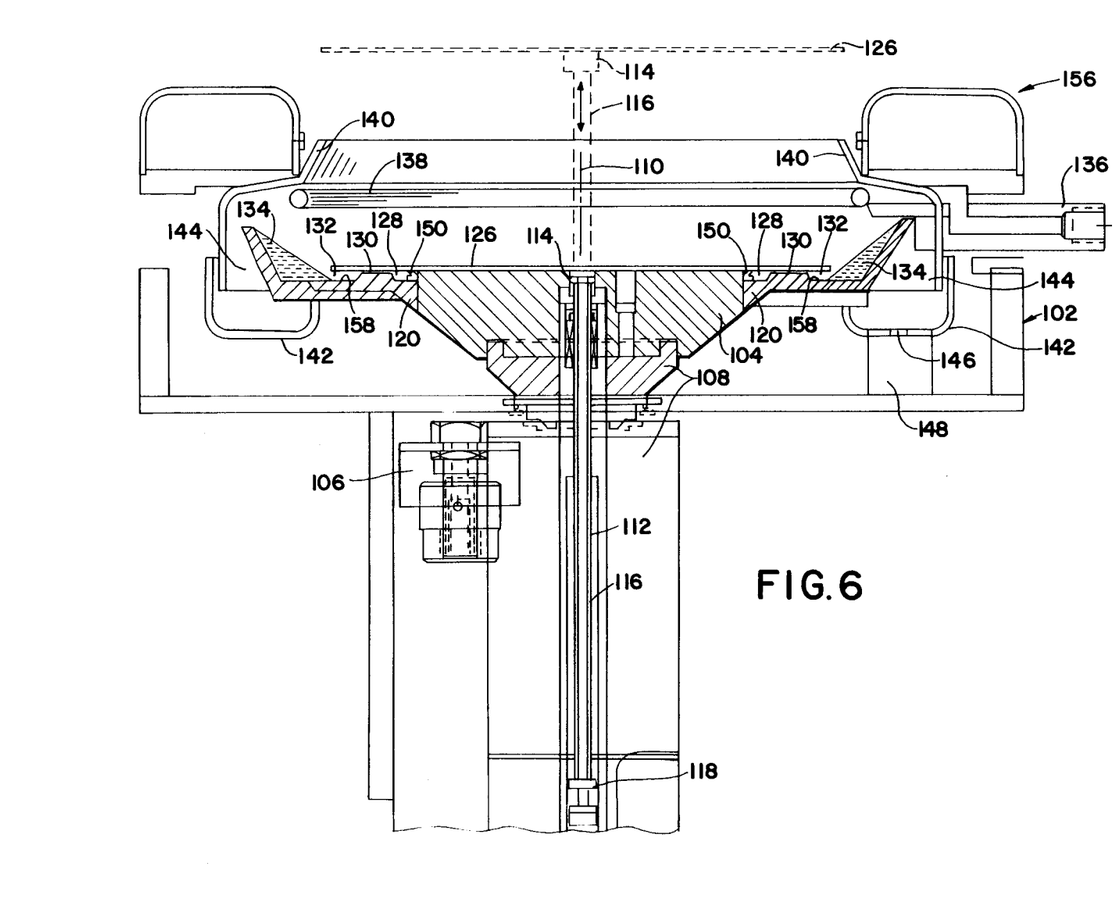
FIG. 6 is a side elevational view, in partial cross-section, illustrating another apparatus for the fluid treatment of a workpiece in accordance with another embodiment of the present invention.

Referring now to FIG. 6, there is shown another embodiment of an apparatus for the fluid treatment of a workpiece or silicon wafer 126 and generally designated by reference numeral 156. It is to be understood that corresponding elements with the apparatus 100 shown in FIG. 1 have been given corresponding numbers. The annular body 120 is provided with a planar upper surface 158 which defines the annular chamber 128 at a location underlying the lower surface of the silicon wafer 126 circumscribing the vacuum chuck 104. The planar upper surface 158 also defines the first annular fluid reservoir 132 circumscribing a peripheral portion of the lower surface of the silicon wafer 126 outwardly of the annular chamber 128. The distance between the lower surface of the silicon wafer 126 and the planar upper surface 158 is substantially uniform between the vacuum chuck 104 and the peripheral edge of the wafer. In other words, the annular chamber 138 and the first annular fluid reservoir 132 form essentially a single annular void underlying the silicon wafer 126 and surrounding the vacuum chuck 104. The planar upper surface 158 also defines the second annular fluid reservoir 134 extending beyond the periphery of the silicon wafer 126 and above the upper surface thereof. The planar upper surface 158 which defines the second annular fluid reservoir 134 extends outward and upward with respect to the upper surface of the silicon wafer 126 at an obtuse angle as previously described.

As the vacuum chuck 104 and annular body 120 are spun about axis 110 by means of motor 106, process fluid may be supplied to the second annular fluid reservoir 134 by means of annular manifold 138. The supplied process fluid will accumulate within the second annular fluid reservoir 134 without flowing into either the annular chamber 128 or first annular fluid reservoir 132, and without wetting either the upper or lower surface of the silicon wafer 126. The amount of process fluid which may be accumulated within the second annular fluid reservoir 134 is a function of the diameter of the annular body 120 forming the second annular fluid reservoir compared to the diameter of the silicon wafer 126, as well as the height of the planar upper surface 158 forming the second annular fluid reservoir and its corresponding angle to the planar upper surface forming the first annular fluid reservoir 132.

The centrifugal force generated by the spinning or rotation of the annular body 120 about axis 110 maintains the process fluid within the second annular fluid reservoir 134 as it is being supplied from the annular manifold 138 and out of contact with the silicon wafer 126. As the speed of rotation increases, the process fluid will rise up along the planar upper surface 158 defining the second annular fluid reservoir 134. The closer the angle of the planar upper surface 158 which defines the second annular fluid reservoir 134 approaches 90° C., the faster one can spin the annular body 120 while retaining process fluid within the second annular fluid reservoir. However, higher spin speeds will be required to discharge the process fluid at the end of the process operation by means of the centripetal force created by rotation of the annular body 120 about axis 110 via motor 106 and vacuum chuck 104. Accordingly, it can be appreciated that the above factors may be balanced to keep the process fluid usage and spin speeds to a minimum.

Figure 7:
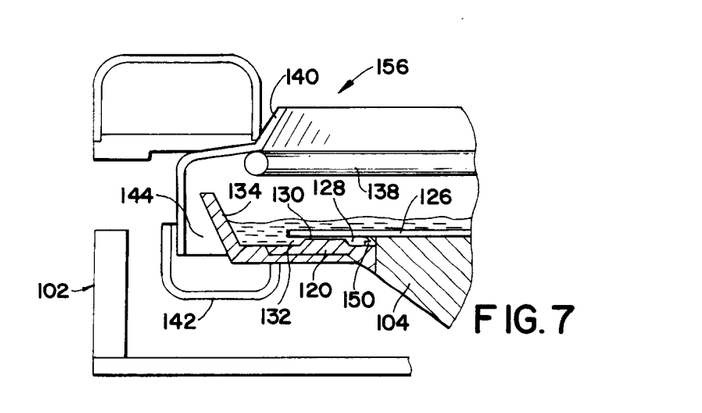
FIG. 7 is a side elevational view, in partial cross-section showing the method of the present invention for the fluid treatment of a workpiece in accordance with the operation of the apparatus illustrated in FIG. 6.

The method of treating a silicon wafer 126 or other workpiece by means of the apparatus 156 will now be described with particular reference to FIG. 7 and partial reference to FIG. 6. The method of submersion of the working surface of the silicon wafer 126 in accordance with the apparatus 156 is substantially the same as previously described with respect to apparatus 100 shown in FIG. 1 and corresponding method described with respect to FIGS. 3 through 5. Upon accumulation of process fluid within the second annular fluid reservoir 134 by means of centrifugal force created by the spinning of the annular body 120, the rotation of the annular body is abruptly stopped. The process fluid accumulated within the second annular fluid reservoir 134 will now flow first into the first annular fluid reservoir 132 underlying a peripheral portion of the silicon wafer 126.

As the process fluid rushes into the first annular fluid reservoir 132, gas within the annular chamber 128, for example, air within housing 102, will be trapped to provide an air pocket circumscribing a portion of the vacuum chuck 104 and adjacent lower surface of the silicon wafer 126. Maintaining of the gas pocket may be enhanced by means of the use of a resilient sealing member 150 having its finger 152 in sealing engagement with the lower surface of the silicon wafer 126. The remaining portion of the process fluid will rush across the upper surface of the silicon wafer 126, uniformly and without impingement thereon to a predetermined height. This height will correspond to the amount of process fluid utilized and the size of the apparatus 156, i.e., the diameter of the annular member 120, diameter of vacuum chuck 104, size of silicon wafer 126, etc. Optionally, the silicon wafer 126 may be independently rotated or maintained stationary with respect to the annular body 120 while supplying the process fluid to the second annular fluid reservoir 134. In this event, a separate motor will be required for the rotation of annular body 120, as well as separating it from the vacuum chuck 104. This rotation of the silicon wafer 126 and annular body 120 may be at corresponding or different revolutions and simultaneously stopped to affect submersion of the upper surface of the silicon wafer. The removal of the process fluid from the apparatus 156 is as previously described with respect to the apparatus 100 shown in FIG. 1.

Figure 8:
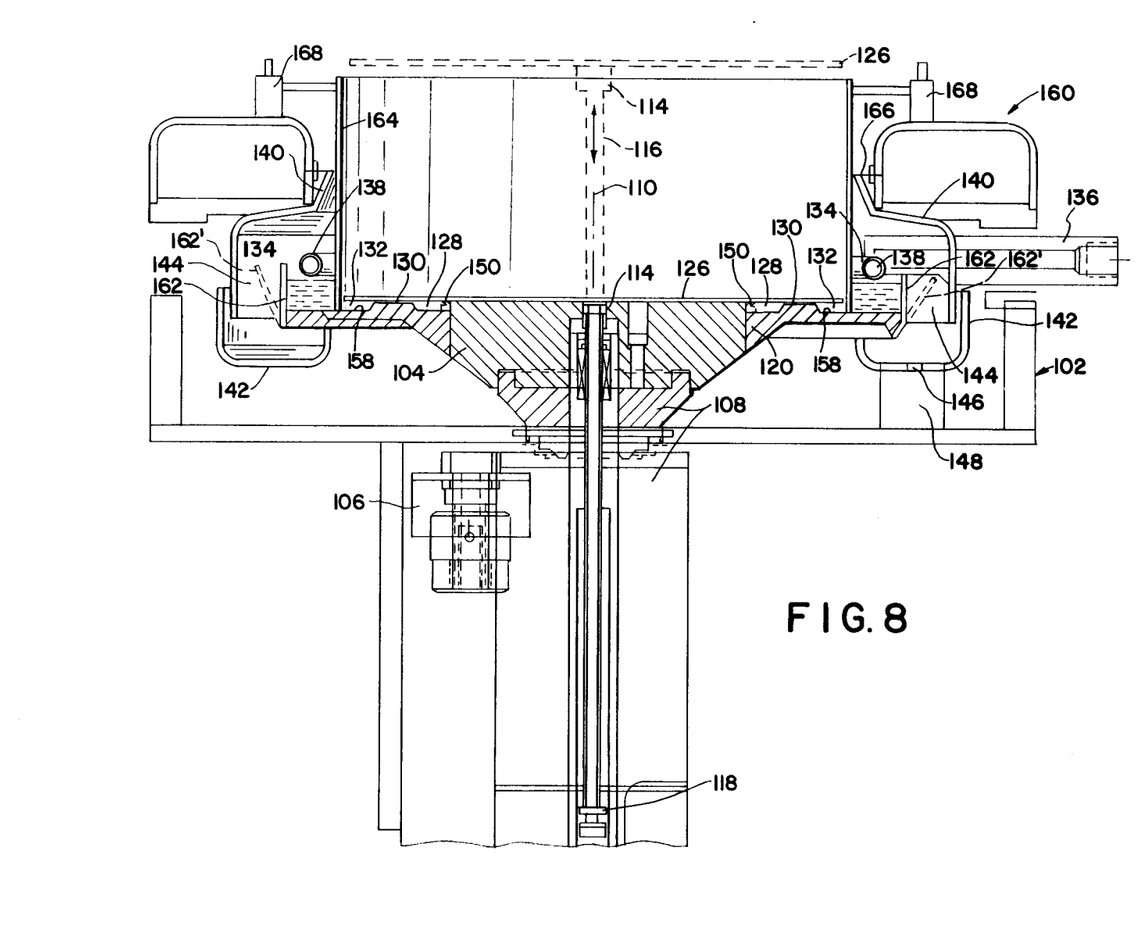
FIG. 8 is a side elevational view, in partial cross-section, illustrating another apparatus for the fluid treatment of a workpiece in accordance with another embodiment of the present invention.

Referring now to FIG. 8, there will now be described the construction of an apparatus for the fluid treatment of a silicon wafer 126 or other workpiece in accordance with another embodiment of the present invention and generally designated by reference numeral 160. Here again, corresponding elements as previously described with respect to apparatuses 100, 156 will have like reference numerals. The second annular fluid reservoir 134 is formed from a peripheral portion of the annular body 120 and an upstanding circumscribing wall 162. The upstanding wall 162 forms essentially a right angle with the planar upper surface 158 of the annular body 120. However, this angle may be an obtuse angle as previously described. A hollow cylinder 164 having an inside diameter slightly greater than the diameter of the silicon wafer 126 is positioned within an opening 166 provided by the mouth of the splash guard 140. The cylinder 164, at its upper end, is attached to a lifting assembly for reciprocating the cylinder between an upper and lower position. The lifting assembly 168 may be in the form of a rack and pinion, hydrolic assembly or the like.

In operation, a silicon wafer 126 or other workpiece is secure to the vacuum chuck 104 as previously described by means of the secondary vacuum chuck 114. The lifting assembly 168 lowers the cylinder 164 until its lower edge forms a fluid tight seal with the planar upper surface 158 of the annular body 120 so as to fluid isolate the first annular fluid reservoir 132 from the second annular fluid reservoir 134. Process fluid is supplied to the second annular fluid reservoir 134 by means of the annular manifold 138. Once a sufficient quantity of process fluid has been accumulated in the second annular fluid reservoir 134, the cylinder 164 is quickly reciprocated upwardly by means of the lifting assembly 168. The on-rushing process fluid first flows into the first annular fluid reservoir 132 so as to trap a gas pocket within the annular chamber 128 as previously described. The remaining portion of the process fluid will rush across the upper surface of the silicon wafer 126 to uniformly and evenly submerge same to a predetermined height without impingement thereon.

Removal of the process liquid is accomplished by spinning the annular body 120 by means of the vacuum chuck 104 and motor 106 as thus far noted. As the upstanding wall 162 is arranged substantially vertical, high spin speeds will be required. Lower spin speeds can be adopted by arranging the upstanding wall 162 at an obtuse angle as by wall 162 shown by the dotted lines.

Figure 9:
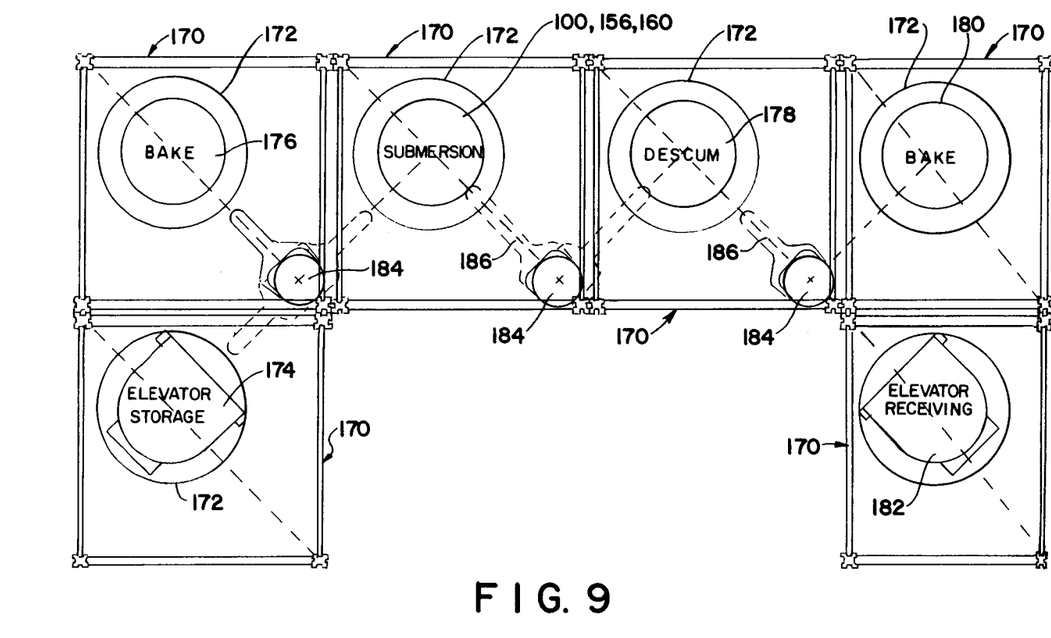
FIG. 9 is a diagrammatic top plan view of a modular processing system including a module for the fluid treatment of a workpiece constructed in accordance with any one of the embodiments illustrated of the present invention.

Referring now to FIG. 9, a plurality of modular processing apparatuses 170, each containing a process module 172, are configured to provide a modular processing system adapted to perform a number of process operations on a silicon wafer being transferred along a track having multiple branches. For example, a U-shaped configuration of a modular processing system is shown beginning with a modular elevator storage apparatus 174, continuing to a cleaning modular apparatus 176, a coating modular apparatus 178, a bake modular apparatus 180, a submersion modular apparatus 100 or 156 or 160 constructed in accordance with the present invention, and finally to an elevator receiving modular apparatus 182. As known from U.S. Pat. No. 4,722,298, each modular processing apparatus 170 is independent of its neighboring apparatus and functions as a stand-alone self-contained building block. Each modular processing apparatus 170 may be replaced by one performing the same function or operation in the event of failure, or with one performing a different function or operation in order to reconfigure the modular processing system to redefine the processing functions.

Certain one's of the modular processing apparatuses 170 are provided with a wafer transporting mechanism 184. The transporting mechanism 184 is constructed generally of an extendable arm 186, for example, one that is constructed to include a plurality of telescopic members having its free end configured for releasably engaging individual silicon wafers 126 and its other end attached to an indexing or rotating mechanism. Specific construction of such a transporting mechanism 184 is generally known in the semiconductor industry and will therefore not be described further. The transporting mechanism 184 is located along a diagonal of the chassis containing one of the processing modules 172 and extends between a pair of opposing corner posts. Each processing module 172 is positioned diagonally opposite the transporting mechanism 184 and symmetrically only about the diagonal.

As further shown, the operative center of each transporting mechanism 184 is equally distant between the centers of neighboring processing modules 172 contained within adjacent modular processing apparatuses 170. This arrangement permits a single transporting mechanism 184 to have the operative capability of transferring a silicon wafer 126 between adjacent processing modules 172. Accordingly, it can be appreciated that the apparatuses 100, 156, 160 in accordance with the present invention may be employed in a variety of process systems adapted for manufacturing integrated circuits from semiconducting wafers or the processing of other workpieces.

Although the invention herein has been described with references to particular embodiments, it is to be understood that these embodiments are merely illustrative of the principles and application of the present invention. It is therefore to be understood that numerous modifications may be made to the embodiments and that other arrangements may be devised without departing from the spirit and scope of the present invention as defined by the dependent claims.

What is claimed is:

1. An apparatus for the fluid treatment of a workpiece, said apparatus comprising
   mounting means for mounting a workpiece thereto, fluid supplying means for supplying a fluid for treating the surface of said workpiece, and
   forming means for forming a gas pocket between a portion of said mounting means and a portion of said workpiece upon supplying said fluid to said workpiece from said fluid supplying means, whereby said gas pocket prevents contact of said fluid with said portion of said mounting means and said portion of said workpiece.

2. The apparatus of claim 1, wherein said forming means includes an annular body having a contour upper surface surrounding said mounting means underlying said workpiece.

3. The apparatus of claim 2, wherein said contour upper surface of said annular body forms an annular chamber surrounding said portion of said mounting means and underlying said portion of said workpiece wherein said gas pocket is formed.

4. The apparatus of claim 3, further including resilient sealing means of annular shape within said annular chamber, said sealing means having a portion in fluid sealing contact with the lower surface of said workpiece when said workpiece is mounted to said mounting means.

5. The apparatus of claim 3, wherein said contour upper surface of said annular body forms an annular gap underlying said workpiece between said annular chamber and a peripheral portion of said workpiece, the distance between the lower surface of said workpiece and said contour upper surface forming said annular gap being less than the corresponding distance forming said annular chamber.

6. The apparatus of claim 5, wherein said contour upper surface of said annular body forms a first annular fluid reservoir underlying said workpiece about a peripheral portion thereof outwardly of said annular gap.

7. The apparatus of claim 6, wherein the distance between the lower surface of said workpiece and said contour upper surface forming said annular gap is less than the corresponding distance forming said first annular fluid reservoir.

8. The apparatus of claim 6, wherein said contour upper surface of said annular body forms a second annular fluid reservoir extending beyond the periphery of said workpiece and above the upper surface thereof.

9. The apparatus of claim 8, wherein said contour upper surface of said annular body forming said second annular fluid reservoir extends outward and upward with respect to the upper surface of said workpiece at an obtuse angle.

10. The apparatus of claim 8, wherein said fluid supplying means comprises an annular manifold arranged overlying said second annular fluid reservoir.

11. The apparatus of claim 1, wherein said mounting means comprises a rotatable vacuum chuck.

12. The apparatus of claim 1, wherein said workpiece comprises a silicon wafer.

13. The apparatus of claim 1, wherein said forming means includes an annular body having an upper surface surrounding said mounting means underlying said workpiece, said upper surface spaced from the lower surface of said workpiece to provide an annular chamber adjacent said mounting means wherein said gas pocket is formed and a first annular fluid reservoir underlying a peripheral portion of said workpiece wherein a portion of said fluid supplied from said fluid supplying means is received.

14. The apparatus of claim 13, wherein said upper surface of said annular body is contoured forming said annular chamber and said first annular reservoir, said upper surface further forming an annular gap underlying said workpiece between said annular chamber and said first annular fluid reservoir, the distance between the lower surface of said workpiece and said contour upper surface forming said annular gap being less than the corresponding distance forming said first annular fluid reservoir and said annular chamber.

15. The apparatus of claim 13, further including resilient sealing means of annular shape within said annular chamber, said sealing means having a portion in fluid sealing contact with the lower surface of said workpiece when said workpiece is mounted to said mounting means.

16. The apparatus of claim 13, wherein said upper surface of said annular body is substantially planar.

17. The apparatus of claim 13, wherein said upper surface of said annular body forms a second annular fluid reservoir extending beyond the periphery of said workpiece and above the upper surface thereof.

18. The apparatus of claim 17, further including an annular ring separating said first annular fluid reservoir from said second annular fluid reservoir, the lower edge of said annular ring forming a fluid seal with the upper surface of said annular body.

19. The apparatus of claim 18, further including means for moving said annular ring into and out of sealing engagement with said upper surface of said annular body to provide fluid communication between said first annular fluid reservoir and said second annular fluid reservoir.

20. The apparatus of claim 17, wherein said upper surface of said annular body forming said second fluid reservoir extends outward and upward with respect to the upper surface of said workpiece at an obtuse angle.

21. The apparatus of claim 20, wherein the surface of said annular body forming said second fluid reservoir is a substantially planar surface.

22. The apparatus of claim 17, wherein said fluid supplying means comprises an annular manifold arranged overlying said second annular fluid reservoir.

23. The apparatus of claim 13, wherein the distance between the lower surface of said workpiece and said upper surface of said annular body is substantially uniform between said mounting means and the peripheral edge of said workpiece.

24. In an apparatus for treating with a fluid a workpiece mounted to a chuck,
    a device comprising a body having an upper surface surrounding said chuck underlying said workpiece, said upper surface forming an annular chamber surrounding a portion of said chuck and underlying a portion of said workpiece, said annular chamber trapping a pocket of gas upon supplying said fluid to said workpiece, whereby said pocket of gas prevents contact of said fluid with said portion of said chuck and said portion of said workpiece.

25. The device of claim 24, wherein said upper surface of said body further forms a first annular fluid reservoir underlying a peripheral portion of said workpiece and an annular gap underlying said workpiece between said annular chamber and said first annular fluid reservoir, the distance between the lower surface of said workpiece and said upper surface of said body forming said annular gap being less than the corresponding distance forming said annular chamber.

26. The device of claim 25, wherein the distance between the lower surface of said workpiece and said upper surface of said body forming said annular gap is less than the corresponding distance forming said first annular fluid reservoir.

27. The device of claim 25, further including resilient sealing means of annular shape within said annular chamber, said sealing means having a portion in fluid sealing contact with the lower surface of said workpiece when said workpiece is mounted to said chuck.

28. The device of claim 25, wherein said upper surface of said body forms a second annular fluid reservoir extending beyond the periphery of said workpiece and above the upper surface thereof, said second annular fluid reservoir having a surface extending outwardly from the upper surface of said workpiece at an obtuse angle.

29. The device of claim 24, wherein said workpiece comprises a silicon wafer.

30. The device of claim 24, wherein the distance between the lower surface of said workpiece and said upper surface of said body is substantially uniform from said annular chamber to the peripheral edge of said workpiece.

* * * * *